United States Patent
Secatch et al.

(10) Patent No.: US 6,687,889 B1
(45) Date of Patent: Feb. 3, 2004

(54) METHOD AND APPARATUS FOR HIERARCHICAL CLOCK TREE ANALYSIS

(75) Inventors: Stacey Secatch, Ft. Collins, CO (US); James Hansen, Loveland, CO (US); Brian Mueller, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/215,125

(22) Filed: Aug. 8, 2002

(51) Int. Cl.[7] .............................................. G06F 17/50
(52) U.S. Cl. ............................. 716/6; 716/10; 716/13; 716/14
(58) Field of Search .............................. 716/6, 10, 13, 716/14

(56) References Cited

U.S. PATENT DOCUMENTS

| | | | |
|---|---|---|---|
| 5,557,779 A | * 9/1996 | Minami ........................ | 716/6 |
| 5,912,820 A | 6/1999 | Kerzman et al. ............... | 716/6 |
| 6,425,114 B1 | * 7/2002 | Chan et al. .................... | 716/6 |
| 6,442,737 B1 | * 8/2002 | Tetelbaum et al. ............. | 716/5 |
| 6,487,707 B1 | * 11/2002 | Kamiya ......................... | 716/8 |
| 2003/0163795 A1 | * 8/2003 | Morgan et al. ................ | 716/10 |

* cited by examiner

*Primary Examiner*—Vuthe Siek
*Assistant Examiner*—Andrea Liu (57) ABSTRACT

A method for accurately analyzing the timing of a clock network on a piecemeal basis in an integrated circuit clock tree is presented. In accordance with the invention, the time delay of each individual subcircuit between an identified clock network node and an identified receiving endpoint may be individually determined. Tags are associated with the connection points of a child block and its parent block. A connection tool uses the tags to match up the connection points of the parent block to the respective connection points in the child block to allow a simulation tool to include the clock signal timing data of the child block in simulating the clock performance of the parent block.

16 Claims, 5 Drawing Sheets

PRIOR ART

METHOD AND APPARATUS FOR HIERARCHICAL CLOCK TREE ANALYSIS

FIELD OF THE INVENTION

The present invention pertains generally to integrated circuits, and more particularly, to a method for accurately analyzing clock timing in a point-to-point manner in a clock tree.

BACKGROUND OF THE INVENTION

Clock networks on CMOS integrated circuits have long been a source of difficulty to integrated circuit designers due to the importance of minimizing skew between clock inputs. A typical integrated circuit includes a clock tree which distributes one or more clock signals throughout the chip to clocked elements. A primary goal of a clock tree is to minimize clock skew between clocked elements. Since all clocked elements on a given tree are driven from one net with a clock spine, skew is caused by differing interconnect lengths and loads.

Clock skew represents a fraction of the clock period that cannot be used for computation. A clock skew of 500 ps with a 200 MHz clock means that 500 ps of every 5 ns clock cycle, or 10 percent of the performance is wasted. That is, clock skew may reduce the time allowed for certain logic paths within the design, and thus may reduce the performance of the design. Thus, for high performance designs that have strict timing requirements, it is often critical to minimize clock skew.

Figure 1:
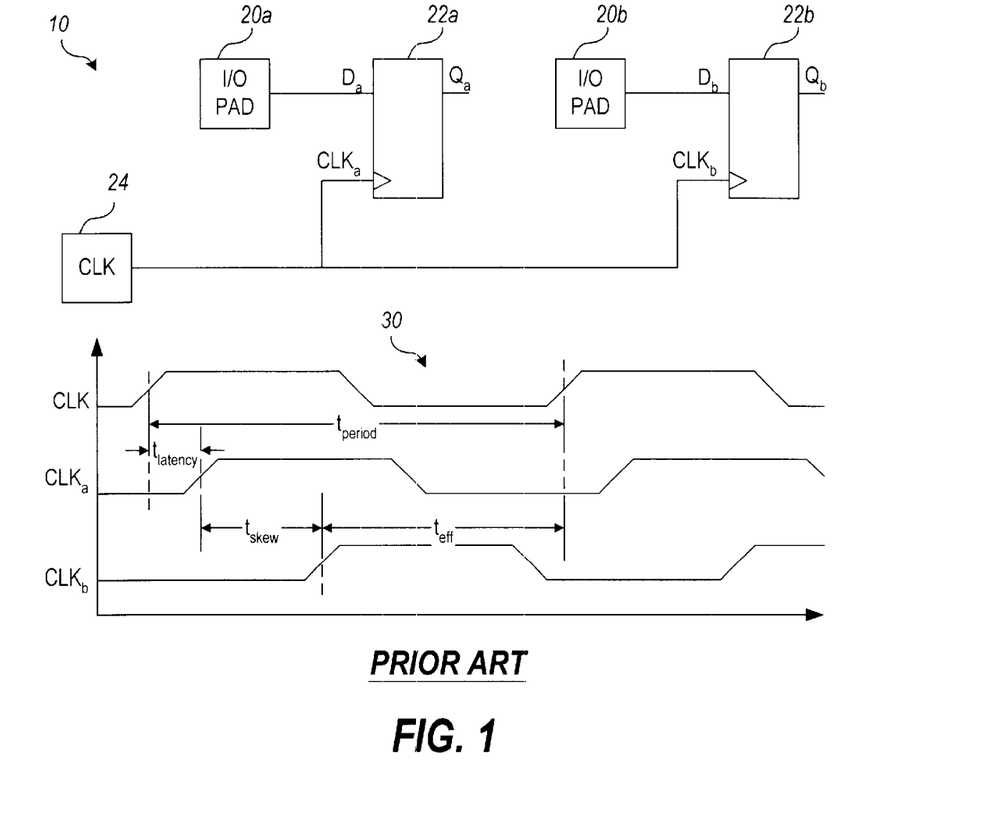
FIG. 1 is a timing diagram illustrating clock skew.

FIG. 1 is a diagram illustrating a reduction in the effective clock period between registers caused by clock skew. An illustrative timing path is shown at 10, and a corresponding timing diagram therefore is shown at 30. The timing path includes a first rising edge triggered register 22a receiving data $D_a$ from a first input/output pad 20a, and a second rising edge triggered register 22b receiving data $D_b$ from a second input/output pad 20b. The first register 22a is clocked by a first clock signal $CLK_a$ and the second register 22b is clocked by a second clock signal $CLK_b$.

With reference to the timing diagram 30, the input clock CLK is shown at 24. The first clock signal $CLK_a$ and the second clock signal $CLK_b$ are generated from the input clock signal CLK 24 via a clock tree or the like. The timing diagram 30 shows that the first clock signal $CLK_a$ is skewed relative to the second clock signal $CLK_b$, as shown by $t_{skew}$. A large clock skew $t_{skew}$ may be caused by an improperly designed clock tree.

On the rising edge of the first clock signal $CLK_a$, the first register 22a may transfer data $Q_a$ from input $D_a$. On the rising edge of the second clock signal $CLK_b$, the second register 22b may transfer data $Q_b$ from input $D_b$. When the subsequent logic (not shown) is designed to receive and use the latched data $Q_a$ and $Q_b$ simultaneously, the clock skew $t_{skew}$ is clearly problematic.

Because of the clock skew $t_{skew}$ between the first and second clock signals $CLK_a$ and $CLK_b$, the effective clock period $T_{eff}$ between the rising edges $CLK_a$ and $CLK_b$ is less than the clock period $T_{period}$. This effectively reduces the time allowed for the data to pass through subsequent logic before receiving the next incoming data, and thus may reduce the effective maximum frequency of the circuit.

Clock skew may have a number of other detrimental effects on the performance of a circuit design. For example, clock skew may cause hold time violations when only a small amount of logic is provided between registers causing malfunction of the circuit. Further, clock skew may cause communication problems between integrated circuits. It should be recognized that these are only illustrative examples of effects that clock skew may have on a system.

For the above reasons, a primary goal of a clock tree is to minimize clock skew between clocked elements. As shown above, clock skew may reduce the effective clock period for certain logic paths within the design, and thus may reduce the performance of the design. For high performance designs that have strict timing requirements, clock skew may consume a substantial portion of the total clock period.

Clock trees may be balanced or unbalanced. Balanced clock trees distribute a number of clock drivers symmetrically and evenly placed on the integrated circuit die. In a balanced tree, the distance between each clock driver and its receiving element is preferably identical, and the load on each driver is matched. Balanced clock trees find suitable application in integrated circuits that are formed with functional blocks characterized by substantially similar loads, for example, memory chips formed with symmetrically balanced memory arrays.

By contrast, unbalanced clock trees distribute clock drivers in a non-symmetrical manner throughout the integrated circuit, generally with higher concentrations of clock drivers where the load is higher and lower concentrations of clock drivers where the load is smaller. Unbalanced clock trees are often utilized in complex circuits that are designed in a functionally hierarchical manner using a plurality of different functional blocks of differing loads. Unbalanced clock trees are typically used in integrated circuits that are partitioned into different functional blocks (and possibly to be designed by different groups of designers).

In the design cycle of a chip with a balanced design, the clock network is typically pre-placed on the integrated circuit die prior to placement of functional logic blocks. This scheme has a number of limitations. First, the clock buffering circuit may interfere with ideal block placement on the chip. This means that area or timing may need to be sacrificed. Second, any smaller blocks than the average will have a larger clock driver than is needed, possibly increasing the amount of power required. This scheme may waste chip resources.

In the design cycle of a chip with an unbalanced design, the clock network is normally added after determining where the appropriate buffers need to be located. This scheme also has a number of limitations. First, it prevents simulation of the clock network until all layers of the hierarchy are complete. This means that a parent block made up of one or more children blocks cannot be simulated until all of its children blocks are complete. As a result, the entire design must be complete before simulation can occur. If, as a result of simulation, it is discovered that one or more clock routes must be adjusted to meet the clock skew requirements, the final artwork is delayed until the layer(s) requiring adjustment are reworked, and the entire adjusted artwork is resimulated. This scheme is clearly time-consuming and costly.

Second, as process generations have advanced, the contributions of parasitic resistance and capacitance of the clock tree routing traces has become a significant portion of the overall clock skew. In order to properly analyze and simulate the performance of the clock network, the clock skew must be determined with sufficient accuracy such that it matches that of the actual design within predetermined error limits. The accuracy level of current circuit simulation tools is typically dependent on the size of the circuit to be analyzed. In other words, a relatively simple circuit with ten to a few hundred nets may be simulated with fairly high accuracy; in contrast, the accuracy level decreases when the number of nets is increased to thousands (or much higher numbers) of nets.

Accordingly, a need exists for an improved method for accurately analyzing and simulating clock performance of a clock network in a functionally hierarchically designed integrated circuit.

SUMMARY OF THE INVENTION

The present invention is a method and apparatus for accurately analyzing the timing of an unbalanced clock network on a piecemeal basis in an integrated circuit clock tree. The present invention allows an entire integrated circuit clock network to be accurately analyzed and simulated on a functional-level basis without requiring higher-level functions to be completed.

The invention applies to functionally hierarchical integrated circuit designs wherein the functionality of the chip is partitioned into different functional blocks located on different functionality levels. More particularly, the internals of certain functional blocks may be implemented on a child level, and the child functional blocks may be used in higher-level functional blocks on a parent level.

In accordance with the invention, during design, the designer of a child functional block associates tags with physical nodes in the child's clock network where connections are to be made to the parent level. The clock network for each child block connecting to a particular parent level is extracted, and the child block tags that specify connection to the parent-level network are stored.

The designer of the parent block associates tags with physical nodes in the parent network where connections are to be made to the child blocks. The parent network, including any peripheral routing desired to minimize or accurately model parasitics, is extracted and again, the parent block tags are stored. The designer maps the parent block tags to the appropriate child block tags where actual electrical connections are to be made.

A simulation tool may then match up the tags between the parent blocks and the child blocks, in accordance with the mapping, to electrically connect the parent network nodes associated with the parent tags to child network nodes associated with the child tags. This allows simulation of the parent level with the clock networks of the children blocks included.

The process may be repeated for each child-to-parent relationship in the functionality hierarchy.

Because the invention allows subcircuits of an integrated circuit to be analyzed and simulated separately and then combined with parent circuits during a later analysis, simulation can be completed earlier in the design timeline. In addition, because the invention allows the entire network to be simulated, better accuracy is available. Furthermore, any tuning that is required to improve clock distribution may be completed much more quickly as data is available without having to recomplete top level extraction.

BRIEF DESCRIPTION OF THE DRAWINGS

The invention will be better understood from a reading of the following detailed description taken in conjunction with the drawing in which like reference designators are used to designate like elements, and in which.

DETAILED DESCRIPTION

A novel method for accurately analyzing clock skew in a point-to-point manner in a clock tree is described in detail hereinafter. Although the invention is described in terms of specific illustrative embodiments, it is to be understood that the embodiments described herein are by way of example only and that the scope of the invention is not intended to be limited thereby.

Figure 2:
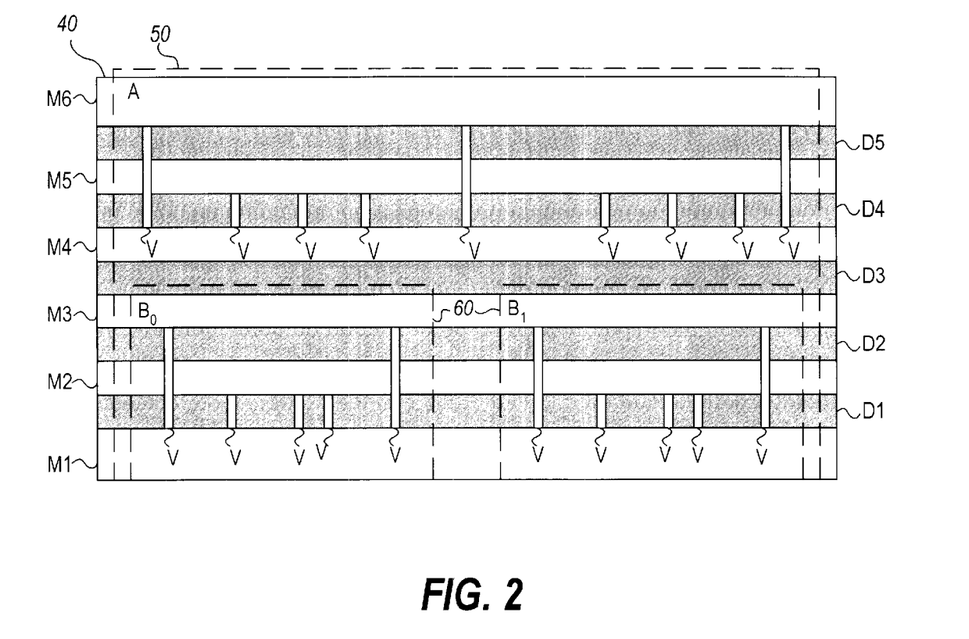
FIG. 2 is a cross-sectional side view of an integrated circuit.

Turning now to the invention, FIG. 2 is a cross-sectional side view of an integrated circuit 40. As illustrated, the integrated circuit 40 comprises a plurality of metal layers M1–M6 separated by dielectric layers D1–D5. Connections are made between layers using conductive vias V formed in intervening dielectric layers D1–D5. In the context of the present invention, the integrated circuit is designed in a functionally hierarchical manner. To this end, the lowest-level connectivity is typically implemented on the lower layers, and the highest-level connectivity is implemented on the upper layers. As a general rule, the lowest-level child functional blocks are typically connected on layer M1, with intra-child-block interconnects routed on layers M2–M3, and parent block connectivity is implemented layer M3 or M4, with intra-parent-block interconnects routed on layers M4 or M5, and inter-parent-block interconnects routed on layer M6.

FIG. 2 illustrates connectivity of a parent functional block A 50 implemented on layers M4–M6 with connections to child functional blocks $B_0$ and $B_1$ 60 implemented on layers M1–M3.

Figure 3:
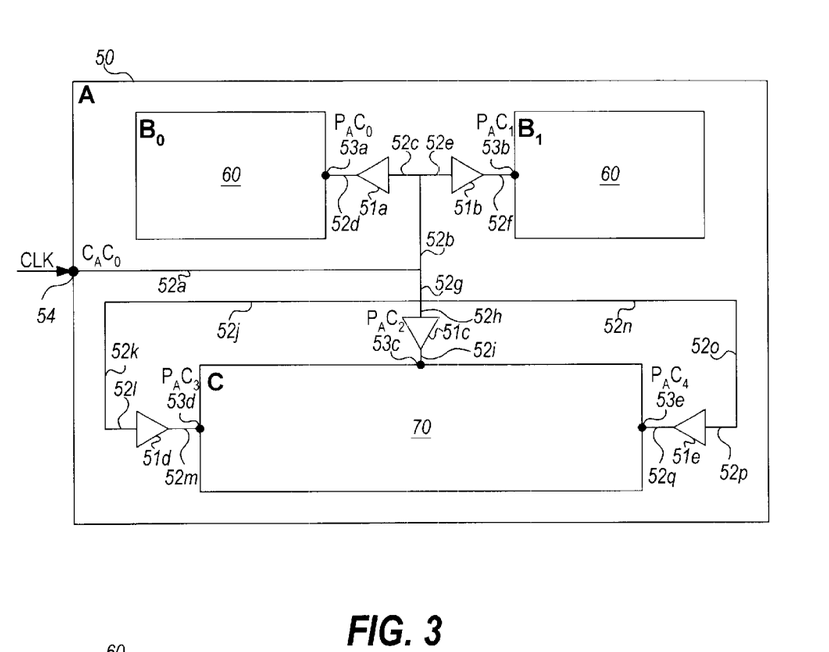
FIG. 3 is a top view of a block diagram of an example parent block of an integrated circuit implemented in accordance with the principles of the invention.

FIG. 3 is a block diagram of an example parent functional block A 50 implemented in an integrated circuit. As illustrated, the parent block A 50 includes a plurality of clock drivers 51a–51e which are connected by traces 52a–52q to drive various functional blocks $B_0$ 60, $B_1$ 60, C 70 whose internals are implemented as child blocks to parent block A 50. In the illustrated embodiment, child blocks $B_0$ 60, $B_1$ 60 are each characterized by an identical load and are functionally identical to one another. By contrast, child block C 70 is characterized by a different load and is functionally different than child blocks $B_0$ 60, $B_1$ 60. Parent block A 50 receives a clock signal input CLK at connection point $C_A C_0$ 54. The clock feeds each of the plurality of functional blocks $B_0$ 60, $B_1$ 60, C 70, at connection points 53a–53e at $P_A C_0$, $P_A C_1$, $P_A C_2$, $P_A C_3$, $P_A C_4$.

Figure 4:
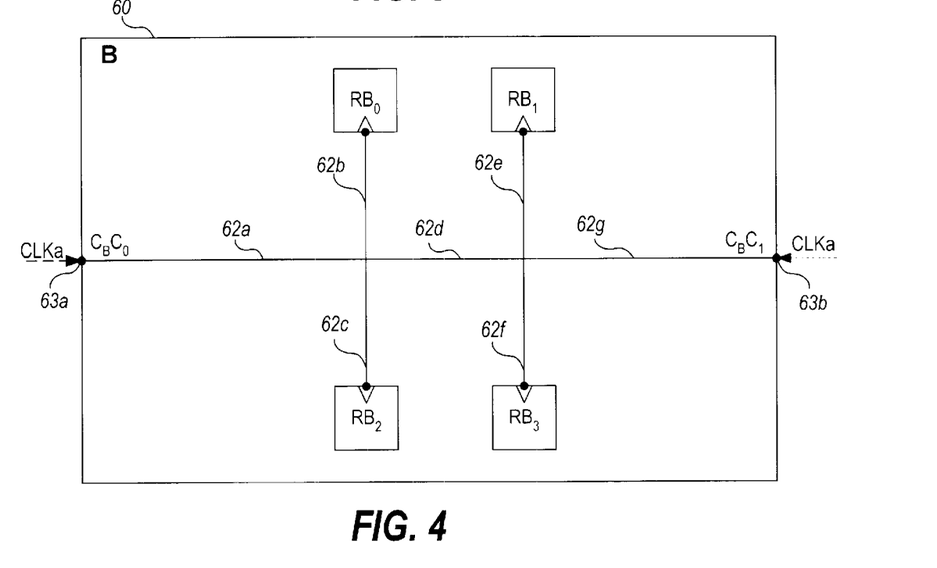
FIG. 4 is a top view of a block diagram of an example child block of FIG. 3 implemented in accordance with the principles of the invention.

FIG. 4 is a block diagram of child block B 60, which may implement child blocks $B_0$ and $B_1$ of FIG. 3. As illustrated, child block B 60 receives a clock signal input CLKa (generated by a clock driver 51a–51e of parent block A 50)

at one or the other of connection point $C_BC_0$ 63a or $C_BC_1$ 63b. The clock signal input CLKa drives a plurality of clocked registers $R_B0$, $R_B1$, $R_B2$, and $R_B3$ over traces 62a–62g.

In accordance with the invention, the time delay of each individual subcircuit between an identified clock network node and an identified receiving endpoint may be individually determined (or substantially approximated within a known error range) within a given child and/or parent block. The accumulated clock time delay values of each subcircuit within a given block may then be used by a simulation tool in accurately simulating the clock performance of the parent block which connects to the child block.

Tags associated with the connection points of a child block to its parent block may then be used by a connection tool to match up the connection points of the parent block to the respective connection points in the child block to allow a simulation tool to include the clock signal timing data of the child block in simulating the clock performance of the parent block.

Figure 5:
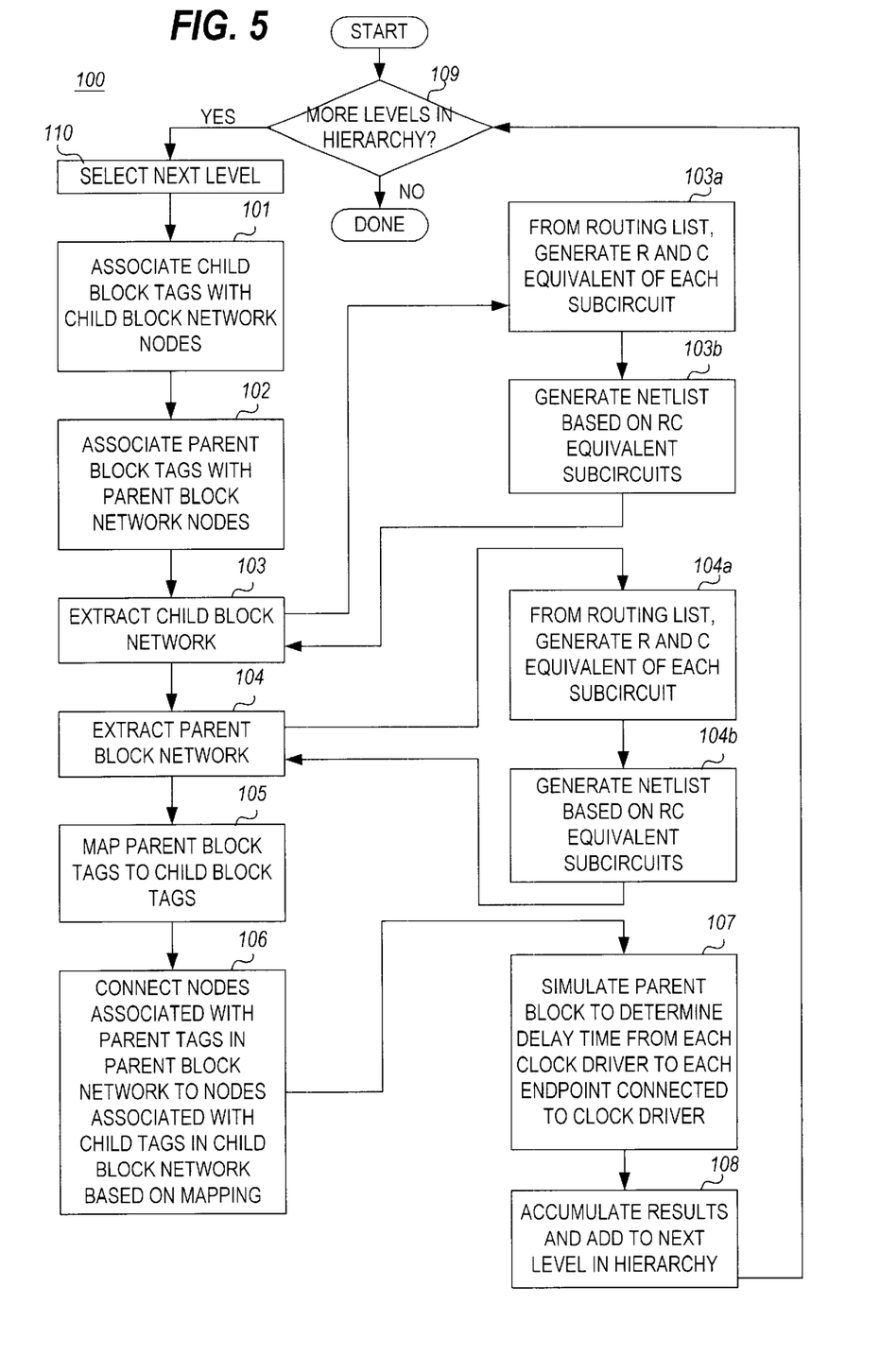
FIG. 5 is an operational flowchart describing the method of the invention.

FIG. 5 is an operational flowchart describing the method of the invention. As illustrated, in an integrated circuit comprising a plurality of hierarchical functional levels, a parent block having one or more child blocks is selected 109/110. For each child block in the parent block, child block tags are associated with each connection point in the child block network to the parent level. Parent tags are similarly associated 102 with each connection point in the parent block network to the child blocks.

Figure 6:
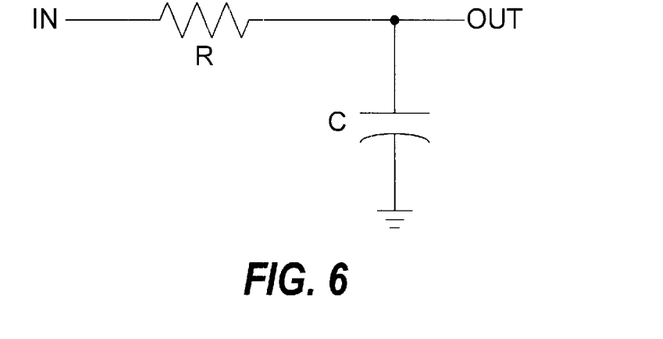
FIG. 6 is a schematic diagram of an RC equivalent circuit of a clock network subcircuit.

The child network is extracted 103, preferably based on the routing list, to determine 103a an equivalent lumped resistance (R) and capacitance (C) circuit for each subcircuit. An example of such a lumped RC circuit is illustrated in FIG. 6. As described previously, as used herein, the term subcircuit refers to the circuit between a given node associated with a tag and each endpoint driven by the signal driving the node associated with the tag. Preferably, the simulation tool generates 103b a netlist based on the equivalent circuits.

The parent network is similarly extracted 104, preferably to find 104a an equivalent resistance RC circuit for each subcircuit and generate 104b a netlist based on the equivalent lumped RC circuits.

The parent tags are mapped 105 to appropriate child tags in a manner indicating that the nodes associated with the mapped tags are electrically connected.

Prior to actual simulation, the nodes associated with the parent and child tags are electrically connected 106 within the analysis/simulation tool according to the mapping. Once connected, the parent block (with connected child blocks) may be simulated to determine the delay time for each subcircuit (i.e., from each tagged node to each endpoint connected to the tagged node). The delay times of each subcircuit are accumulated, and may be added to the next level simulation in the functional block hierarchy.

With reference to FIG. 4, the connection points of the child block B are to be tagged by the block designer in accordance with the invention at points $C_BC_0$ or $C_BC_1$. Each subcircuit comprising a clock trace segment of the child block B may be simulated using a simulation tool to determine within a known error range the timing delay of the clock trace subcircuit. The child block may therefore be simulated without including the parent block circuit and therefore without even requiring the parent block to be completed.

For example, consider the subcircuit comprising the circuit between tagged node $C_BC_0$ 63a and clocked register $RB_0$. This subcircuit includes traces 62a and 62b. The analysis/simulation tool extracts the length and trace parameters (e.g., width, thickness, trace resistivity, etc.) of each of the traces 62a and 62b in the subcircuit. The analysis/simulation tool uses trace tales to look up the parasitic resistance R and capacitance C values for the traces. Based on these values, the analysis/simulation tool can replace the subcircuit with an equivalent lumped RC circuit as shown in FIG. 6. The tool may then repeat the process for each subcircuit in the block (e.g., $C_BC_0$ to $RB_1$, $C_BC_0$ to $RB_2$, $C_BC_0$ to $RB_3$, $C_BC_1$ to $RB_0$, $C_BC_1$ to $RB_1$, $C_BC_1$ to $RB_2$, and $C_BC_1$ to $RB_3$).

With reference to FIG. 3, the connection points of the parent block A are to be tagged by the block designer in accordance with the invention at points $P_AC_0$, $P_AC_1$, $P_AC_2$, $P_AC_3$, or $P_AC_4$. Each subcircuit comprising a clock trace segment of the parent block B between the input point tagged at connection point $C_AC_0$ may then be simulated according to the same method described with respect to the child block using the simulation tool to determine within a known error range the clock signal timing delay. The performance of the parent block clock network may therefore be simulated without including the child block circuit and therefore without even requiring the child blocks to be completed. Of course, it will be appreciated that the full analysis of the parent block cannot be fully completed without the data from the child blocks.

To this end, when the simulation of the child blocks are completed, the child blocks may be connected to the parent blocks according to a parent-tag-to-child-tag map provided by the designer(s). In particular, the map must indicate the correct connection points in both the parent and child. For example, while child functional blocks B0 and B1 60 are functionally identical and implemented identically, the parent clock network connects to a different connection point in B0 than in B1. As shown in FIG. 3, the clock signal input provided by parent block clock driver 51a drives connection point PAC0, while the clock signal input provided by clock driver 51b drives connection point PAC1. However, PAC0 connects to the right-hand clock signal input 63b of child block B0, which PAC1 connects to the left-hand clock signal input 63a of child block B1. Accordingly, while the child blocks B0 and B1 may be implemented identically, because the clock signal is input to different connection points, the timing delay for each subcircuit will not be identical.

Once a parent-tag-to-child-tag map has been developed, the parent block may be fully simulated by instructing the connection tool to match the parent tags to the appropriate child tags according to a parent-to-child-tag mapping. The connection tool connects the nodes identified by the tags and then the simulation tool simulates the clock circuit, including the child blocks.

Figure 7:
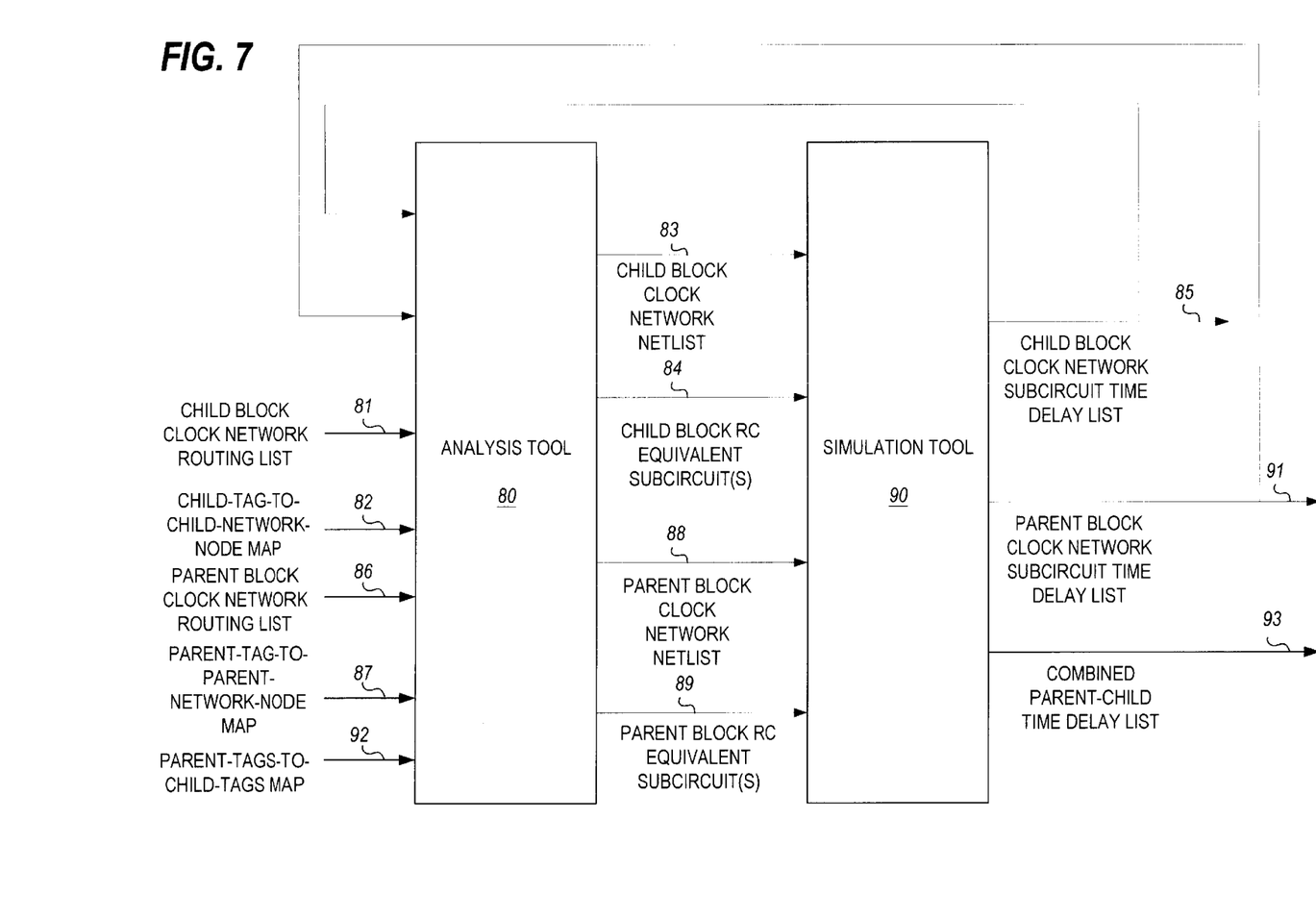
FIG. 7 is a block diagram of a system for analyzing and simulating an integrated circuit having a functionally hierarchical design in accordance with the invention.

FIG. 7 is a block diagram of a system for analyzing and simulating an integrated circuit having a functionally hierarchical design in accordance with the invention. As illustrated, the system includes an analysis tool 80 (e.g., rc extraction) and a simulation tool 90. The analysis tool 80 receives the routing list 81 of the child block clock network and child-tag-to-child-network-node map 82. The analysis tool 80 extracts the child network and generates a child block netlist 83. The analysis tool 80 also determines an equivalent RC circuit 84 for each subcircuit in the child network.

The simulation tool 90 (e.g. SPICE) simulates the subcircuit 84 to determine the time delay 85 for each child subcircuit. The analysis/simulation tools 80/90 store the child tag map 82, netlist 83, and subcircuit time delay information 85.

The analysis tool 80 then receives the routing list 86 of the parent block clock network and parent-tag-to-parent-network-node map 87. The analysis tool 80 extracts the parent network and generates a parent block netlist 88. The analysis tool 80 determines an equivalent RC circuit 89 for each subcircuit in the parent network.

The simulation tool 90 simulates each subcircuit to determine the time delay 91 for each parent subcircuit. The analysis/simulation tools 80/90 store the parent tag map 87, parent netlist 88 and parent subcircuit time delay information 91.

The connection tool 80 receives a parent-tag-to-child-tag map 92. Based on the mapping, the analysis tool 80 connects nodes in the parent network to nodes in the child network as appropriate. The parent network may then be resimulated using the simulation tool 90 to determine the combined time delay 93 of each subcircuit in the parent network, taking into account the previously determined time delays 84 of the child network subcircuits.

The process may be repeated for the next hierarchical level if the parent bock is a child to a higher-level functional block. In this manner, each hierarchical level in the functional design of the chip is simulated separately with each subcircuit reduced to a simple lumped RC equivalent circuit. The equivalent RC circuits of the subcircuits may then be used when included in the simulation of the parent block to reduce number of nets and therefore the size of the problem submitted to the tool 80, and therefore reduce the amount of time required for the tool to analyze and simulate the circuit while also preserving a desired level of accuracy. In other words, neither the tool's capacity limits nor the resulting precision are taxed.

Although the illustrative embodiment of the functionally hierarchical design of the integrated circuit shown in FIGS. 3 and 4 includes only two levels of functionality (i.e., one parent level including functional block A and one child level including functional blocks $B_0$, $B_1$, and C), it is recognized that a typical integrated circuit design may include a number of hierarchical levels of functionality, such that the number of parent and child levels may be plural. It will be appreciated by those skilled in the art that the invention may be iterated for each child-parent relationship in the hierarchy.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method for analyzing clock skew in a hierarchical clock tree comprising one or more parent blocks each having one or more child blocks, said method comprising:

obtaining one or more child block tags associated with respective child block nodes in said at least one child block;

extracting one or more child block network subcircuits, each said child subcircuit comprising a child subcircuit input node and one or more child subcircuit endpoint nodes;

for each said one or more child block network subcircuits, determining a time delay between said child subcircuit input node and each of said one or more child subcircuit endpoint nodes;

obtaining one or more parent tags associated with respective parent block nodes in said at least one parent block;

extracting one or more parent block network subcircuits, each said parent subcircuit comprising a parent subcircuit input node and one or more parent subcircuit endpoint nodes;

for each said one or more parent block network subcircuits, determining a time delay between said parent subcircuit input node and each of said one or more parent subcircuit endpoint nodes;

obtaining a map of said parent block tags to respective ones of said child block tags;

connecting said respective parent block nodes associated with said one or more parent tags to said respective child block nodes associated with said one or more child tags mapped to said respective one or more parent tags;

for each of said parent block subcircuits, determining said accumulated time delay between said parent subcircuit input node and each of said one or more child subcircuit endpoint nodes of child subcircuits connected to said parent subcircuit, taking into account said associated child subcircuit time delay and said respective parent subcircuit time delay associated with said parent block.

2. A method in accordance with claim 1, wherein said step for obtaining one or more child block tags comprises:

associating said one or more child block tags with said respective child block nodes in said at least one child block.

3. A method in accordance with claim 1, wherein said step for obtaining one or more parent block tags comprises:

associating said one or more parent block tags with said respective parent block nodes in said at least one parent block.

4. A method in accordance with claim 1, wherein said step for obtaining a map of said parent block tags to respective ones of said child block tags comprises:

mapping said parent block tags to respective ones of said child block tags.

5. A method in accordance with claim 1, wherein:

said step for obtaining one or more child block tags comprises
associating said one or more child block tags with said respective child block nodes in said at least one child block;

said step for obtaining one or more parent block tags comprises
associating said one or more parent block tags with said respective parent block nodes in said at least one parent block; and said step for obtaining a map of said parent block tags to respective ones of said child block tags comprises mapping said parent block tags to respective ones of said child block tags.

6. A method in accordance with claim 1, wherein:

said step for determining a time delay between said child subcircuit input node and each of said one or more child subcircuit endpoint nodes comprises:
for each said child subcircuit endpoint nodes:
generating an equivalent circuit modeling an electrical circuit between each said respective one of said child subcircuit endnodes and said child subcircuit input node; and
simulating each said equivalent circuit to obtain said time delay; and
said step for determining a time delay between said parent subcircuit input node and each of said one or more parent subcircuit endpoint nodes comprises:

for each said parent subcircuit endpoint nodes:
generating an equivalent circuit modeling an electrical circuit between each said respective one of said parent subcircuit endnodes and said parent subcircuit input node; and
simulating each said equivalent circuit to obtain said time delay.

7. A method in accordance with claim 6, wherein:
said step for determining said accumulated time delay between said parent subcircuit input node and each of said one or more child subcircuit endpoint nodes of child subcircuits connected to said parent subcircuit comprises:
for each said child subcircuit endpoint nodes:
adding said determined time delay between said parent subcircuit input node to a parent node associated with a parent tag that is mapped to a child subcircuit input node and said determined time delay between said child subcircuit input node and said respective child subcircuit endpoint node to generate said accumulated time delay between said parent subcircuit input node and said respective child subcircuit endpoint node.

8. A method in accordance with claim 6, wherein said step for obtaining one or more child block tags comprises:
associating said one or more child block tags with said respective child block nodes in said at least one child block.

9. A method in accordance with claim 6, wherein said step for obtaining one or more parent block tags comprises:
associating said one or more parent block tags with said respective parent block nodes in said at least one parent block.

10. A method in accordance with claim 6, wherein said step for obtaining a map of said parent block tags to respective ones of said child block tags comprises:
mapping said parent block tags to respective ones of said child block tags.

11. A method in accordance with claim 6, wherein:
said step for obtaining one or more child block tags comprises
associating said one or more child block tags with said respective child block nodes in said at least one child block;
said step for obtaining one or more parent block tags comprises
associating said one or more parent block tags with said respective parent block nodes in said at least one parent block; and
said step for obtaining a map of said parent block tags to respective ones of said child block tags comprises mapping said parent block tags to respective ones of said child block tags.

12. A method in accordance with claim 6, wherein:
said equivalent circuit generated for said child subcircuit comprises an RC circuit.

13. A method in accordance with claim 6, wherein:
said equivalent circuit generated for said parent subcircuit comprises an RC circuit.

14. A method in accordance with claim 6, wherein:
said equivalent circuit generated for said child subcircuit comprises an RC circuit; and
said equivalent circuit generated for said parent subcircuit comprises an RC circuit.

15. A system for analyzing clock skew in a hierarchical clock tree comprising one or more parent blocks each having one or more child blocks, said system comprising:
an analysis tool which receives a child block network routing list of a child block, one or more child block tags associated with respective child block nodes in said child block, a parent block network routing list of a parent block, one or more parent tags associated with respective parent block nodes in said parent block, and a map of parent tags to child tags, which generates a child block netlist, one or more child block network subcircuits each comprising a child subcircuit input node and one or more child subcircuit endpoint nodes, a parent block netlist, and one or more parent block network subcircuits each comprising a parent subcircuit input node and one or more parent subcircuit endpoint nodes; and
a simulation tool which receives said child block netlist and said one or more child block network subcircuits, and simulates said one or more child block network subcircuits to generate a time delay between said child subcircuit input node and each of said one or more child subcircuit endpoint nodes for each said one or more child block network subcircuits; and which receives said parent block netlist and said one or more parent block network subcircuits and simulates said one or more parent block network subcircuits to generate a time delay between said parent subcircuit input node and each of said one or more parent subcircuit endpoint nodes for each said one or more parent block network subcircuits; and which determines, for each of said parent block subcircuits, an accumulated time delay between said parent subcircuit input node and each of said one or more child subcircuit endpoint nodes of child subcircuits having nodes mapped to nodes of said parent subcircuit, taking into account said associated child subcircuit time delay and said respective parent subcircuit time delay associated with said parent block.

16. A system in accordance with claim 15, wherein:
said child block network subcircuits generated by said analysis tool comprise RC circuits; and
said parent block network subcircuits generated by said analysis tool comprise RC circuits.

* * * * *